(12) United States Patent
Karabatsos

(10) Patent No.: US 6,392,162 B1
(45) Date of Patent: May 21, 2002

(54) DOUBLE-SIDED FLEXIBLE JUMPER ASSEMBLY AND METHOD OF MANUFACTURE

(76) Inventor: Chris Karabatsos, 42 Jumping Brook La., Kingston, NY (US) 12401

(*) Notice: Subject to any disclaimer, the term of this patent is extended or adjusted under 35 U.S.C. 154(b) by 0 days.

(21) Appl. No.: 09/711,680

(22) Filed: Nov. 10, 2000

(51) Int. Cl.$^7$ ................................................. H01R 9/07
(52) U.S. Cl. ................ 174/261; 174/113 R; 174/117 F; 29/821; 439/493
(58) Field of Search ........................... 174/250, 117 F, 174/113 R, 116, 261; 29/825; 361/803; 439/74, 493, 581

(56) References Cited

U.S. PATENT DOCUMENTS

| | | | | |
|---|---|---|---|---|
| 3,576,941 A | * | 5/1971 | Colglazier | 174/117 R |
| 4,470,195 A | * | 9/1984 | Lang | 29/825 |
| 5,030,137 A | * | 7/1991 | Bernhardt | 439/492 |
| 5,428,190 A | * | 6/1995 | Stopperan | 174/261 |
| 5,949,657 A | * | 9/1999 | Karabatsos | 361/803 |
| RE36,845 E | * | 8/2000 | Huppenthal et al. | 439/581 |

* cited by examiner

Primary Examiner—Albert W. Paladini
(74) Attorney, Agent, or Firm—Mark P. White

(57) ABSTRACT

A flexible asymmetrical jumper assembly is used to electrically join to circuit boards together where the geometry requires that the jumper be bent, often in a tight loop, so that the pads which form the ends of the jumper are parallel to each other. The jumper assembly contains two sets of wires, each set containing an array of foil fingers terminated in pads. The upper set of wires is bonded to the upper side of a central insulating sheet, while the lower set is bonded to the lower side of the central insulating sheet. An upper insulating sheet is bonded to the upper side of the upper set of wires, leaving the pads exposed for later soldering. A lower insulating sheet is likewise bonded to the lower side of the lower set of wires, with the pads also exposed. A hole is drilled through each upper pad, through the center insulating sheet, and into the corresponding lower pad. The holes are then through plated. The pads are of two different types, a major, or larger pad, and a minor, or smaller pad. The pads are disposed on the fingers such that each upper major pad is adjacent to a corresponding lower minor pad, and vice versa. As a result, the stress raisers created at the line where the upper insulator is bonded to the upper set of wires is offset from the stress raiser created at the line where the lower insulator is bonded to the lower set of wires.

15 Claims, 6 Drawing Sheets

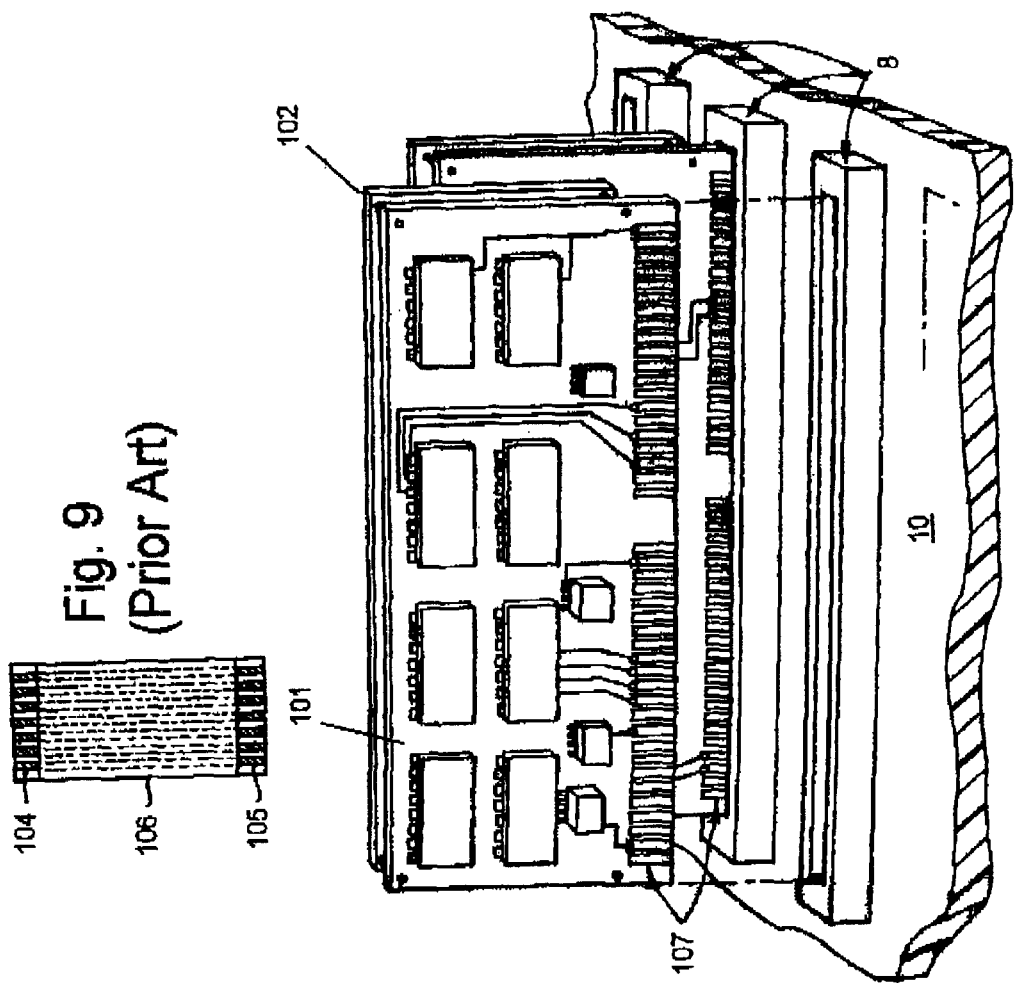
Fig. 9 (Prior Art)
Fig. 6 (Prior Art)
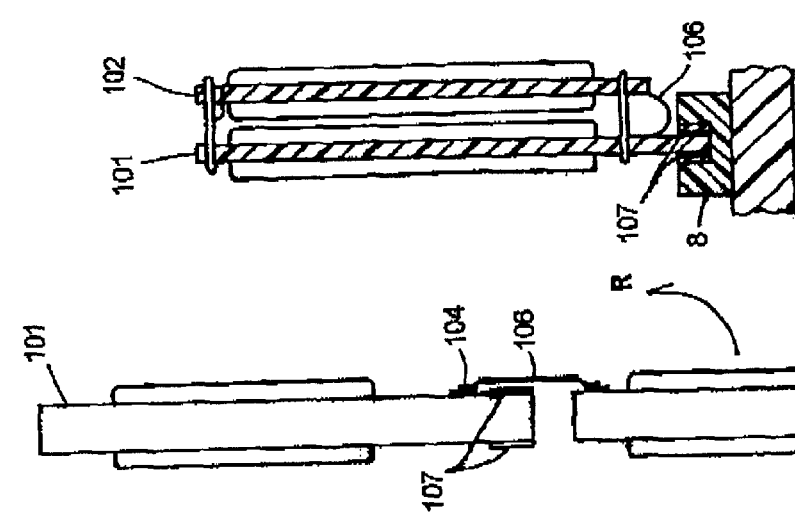
Fig. 8 (Prior Art)
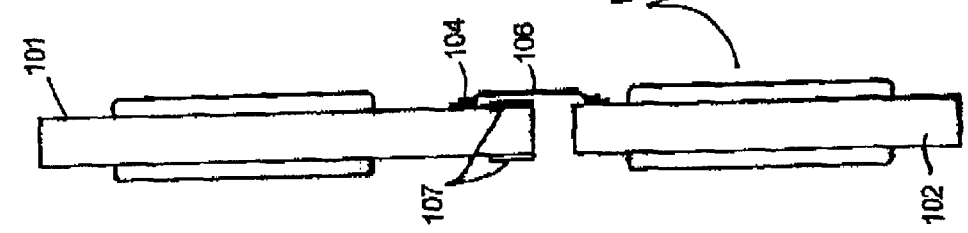
Fig. 7 (Prior Art)

DOUBLE-SIDED FLEXIBLE JUMPER ASSEMBLY AND METHOD OF MANUFACTURE

BACKGROUND OF THE INVENTION

1. Field of the Invention

The present invention relates to interconnections used in the manufacturing of electronic circuit boards, and more specifically, to jumpers used in said manufacture.

2. Description Relative to the Prior Art

Designers of electronic circuits are forever striving to reduce the size of electronic assemblies through miniaturization of the electronic components and maximize space utilization.

The assembly of high-speed memory modules requires the grouping of integrated circuit packages in a closely-interconnected configuration. The packaging configuration must be flexible enough to allow expansion of the memory capacity by addition or substitution of components where the space unused in a low memory capacity system must be balanced against the memory expanding capability.

There is a need for an improved packaging technique that would provide for the convenient expansion of the memory module without requiring a large space allocation in the basic configuration of the module. Such modules are assembled with rigid printed circuit hoards and the flexible jumpers described herein.

The principal objective of this invention are to provide an interconnecting packaging technique for assembling rigid memory modules in a compact arrangement that do not require substantial space allocation for the interconnection of the rigid boards and, at the same time, provide short line lengths, high speed, high reliability and short radius with a 180 degree rotation without subjecting the printed wire conductors to breakage.

This is achieved by combining a number of printed circuit wires on both sides of an insulating substrate such as KAPTON. This layered arrangement of printed wires on both sides of the insolating substrate has each printed wire terminating to a set of combs by means of pads on each side of the wire. Said pads are arranged in a form of mirrored position so that a hole or via is drilled through both corresponding pads. Said via is plated through to provide electrical connection between the upper and lower corresponding pads. Said pads are plated to allow soldered connection to pads of rigid circuit boards.

This general method of connection of multiple circuit boards onto a mother board using a single edge connector is well known in the art, and is the subject of U.S. Pat. No. 5,949,657, issued to Chris Karabatsos, the inventor of the current invention.

The prior art may be understood by referring to FIGS. 6, 7, 8, and 9. FIG. 6 shows a perspective view of two circuit boards, 101 and 102, wherein circuit board 101 contains a comb of contacts 107 which are matingly inserted into one of the edge connectors 8. Referring to FIG. 8, which shows a cross section view of the front assembly shown in FIG. 6, the contacts 107 are shown inserted into the edge connector 8. Also shown in FIG. 8, the jumper assembly 106 is shown.

Referring now to FIG. 7, the two circuit boards 101 and 102 are shown at an early stage of manufacture. The prior art jumper assembly 106, as shown in plan view in FIG. 9, is attached with its upper pads 104 soldered to pads on circuit board 101, and with its lower pads 105 attached to lower board 102. The lower board is then rotated anti-clockwise, in the direction indicated by R in FIG. 7, thus causing the jumper assembly 106 to assume the shape shown in FIG. 8.

The difference between the current invention, and the prior art described in U.S. Pat. No. 5,949,657, is only related to the construction of the jumper assembly. The method of use of the current jumper assembly is identical to that of the prior art jumper assembly described above.

The current invention solves this problem by providing a jumper assembly with a central insulator sheet, and an array of wires or fingers on each face of the central insulator. The array on the top face of the central insulator is the mirror image of the array of wires on the bottom face, except for the length of the pads. The pads are asymmetrical with respect to adjacent pads from the mirror image array. As a result, the points of maximum stress from one array do not align with the points of maximum stress from the facing array.

SUMMARY OF THE INVENTION

It is a general object of the present invention to provide a jumper which is flexible, but still has superior mechanical strength. It is a further object of the present invention to provide such a jumper which provides a superior electrical connection as well.

In accordance with one aspect of the invention, a jumper assembly for use in interconnecting electronic components includes a central insulation sheet having an upper side and a lower side, and a first and second set of printed wires, each of which has a multiplicity of foil fingers, spaced from each other, each finger having a top side, a bottom side, and two ends. Each such finger further includes a central area, a major pad, having a length, integrally affixed to one end of the finger, and a minor pad, having a length different than that of the major pad, and integrally affixed to the other end of the finger. The first set of printed wires are bonded at the bottom side to the upper side of the insulation sheet, and the second set of printed wires are bonded at the top side to the lower side of the insulation sheet, so that the major pads of one set of printed wires are adjacent to the minor pads of the other set of printed wires. A first external insulation sheet is bonded to the top side of the first set of printed wires, while a second external insulation sheet is bonded to the bottom side of the second set of printed wires.

In accordance with a second aspect of the invention, a plated-through hole is formed in each pad.

In accordance with a third aspect of the invention, each pad has a facing pad disposed on the opposite side of the central insulation sheet, and a solder connection connects the plated-through holes between each pad and the facing pad.

In accordance with a fourth aspect of the invention, the printed wires are formed of copper foil.

In accordance with a fifth aspect of the invention, the central insulation sheet, and the first and second external insulation sheets are flexible insulators.

In accordance with a sixth aspect of the invention, the insulation sheets are made of KAPTON.

In accordance with a final aspect of the invention, the solder connections between each pad and the facing pad are reflow-soldered connections.

BRIEF DESCRIPTION OF THE DRAWINGS

These, and further features of the invention, may be better understood with reference to the accompanying specification and drawings depicting the preferred embodiment, in which:

FIG. 6 depicts a prior art circuit board inserted into an edge connector.

FIG. 7 depicts a prior art pair of circuit boards joined by a prior art jumper.

FIG. 8 depicts the prior art circuit boards of FIG. 7 rotated to a parallel position.

FIG. 9 depicts a prior art jumper.

DESCRIPTION OF THE PREFERRED EMBODIMENTS.

Figure 1:
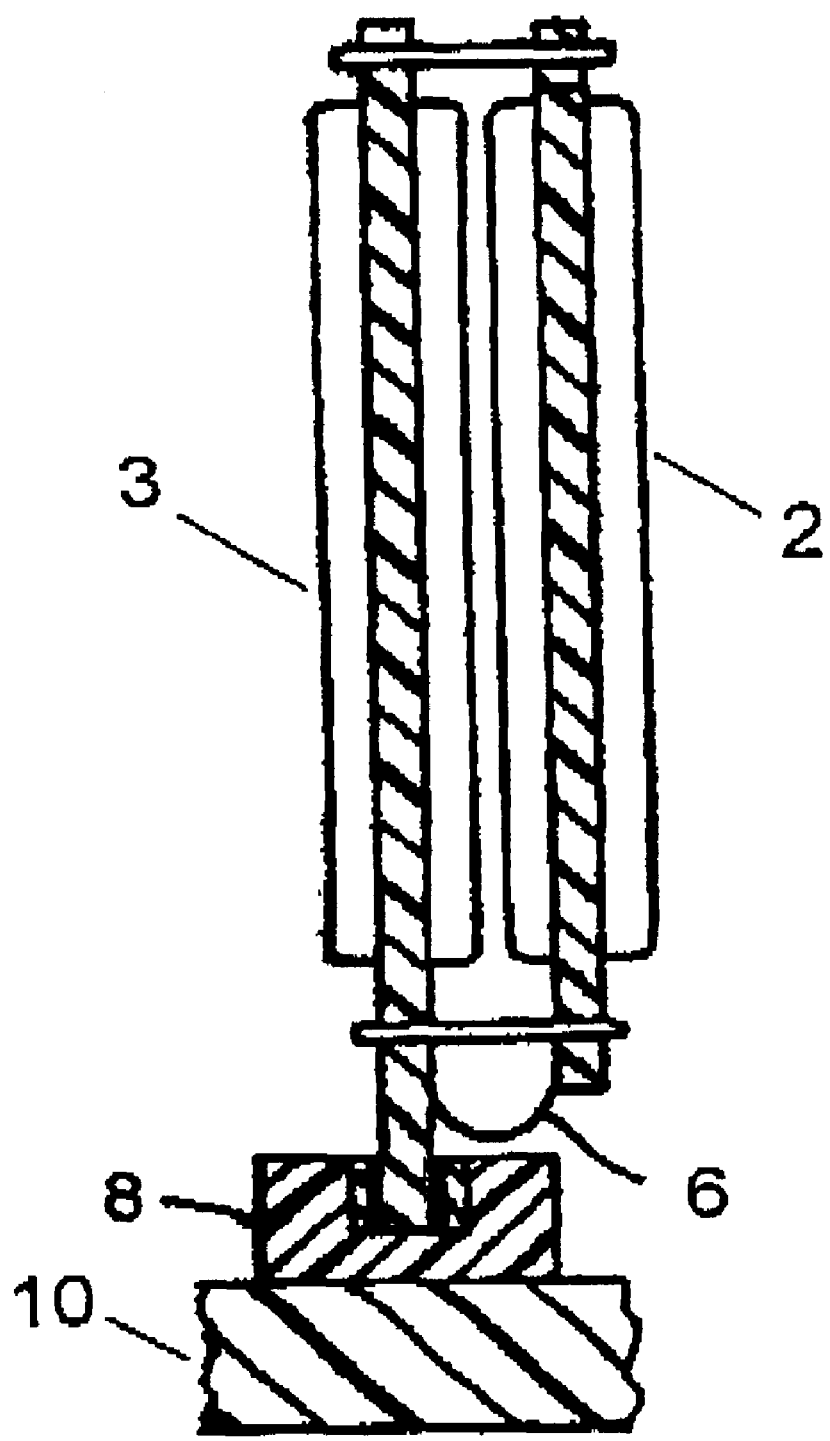
FIG. 1 depicts a cross-sectional view of the jumper interconnecting two circuit boards.

The present invention may be understood by first referring to FIG. 1, which shows two printed circuit boards, a first board 2, mounted in parallel with a second board 3, and the two electrically interconnected by means of a flexible, multi-conductor jumper 6. In FIG. 1, the two boards are interconnected with a motherboard 10 by means of a connector 8, into which a comb of connecting contacts formed onto board 3 are inserted.

Figure 3:
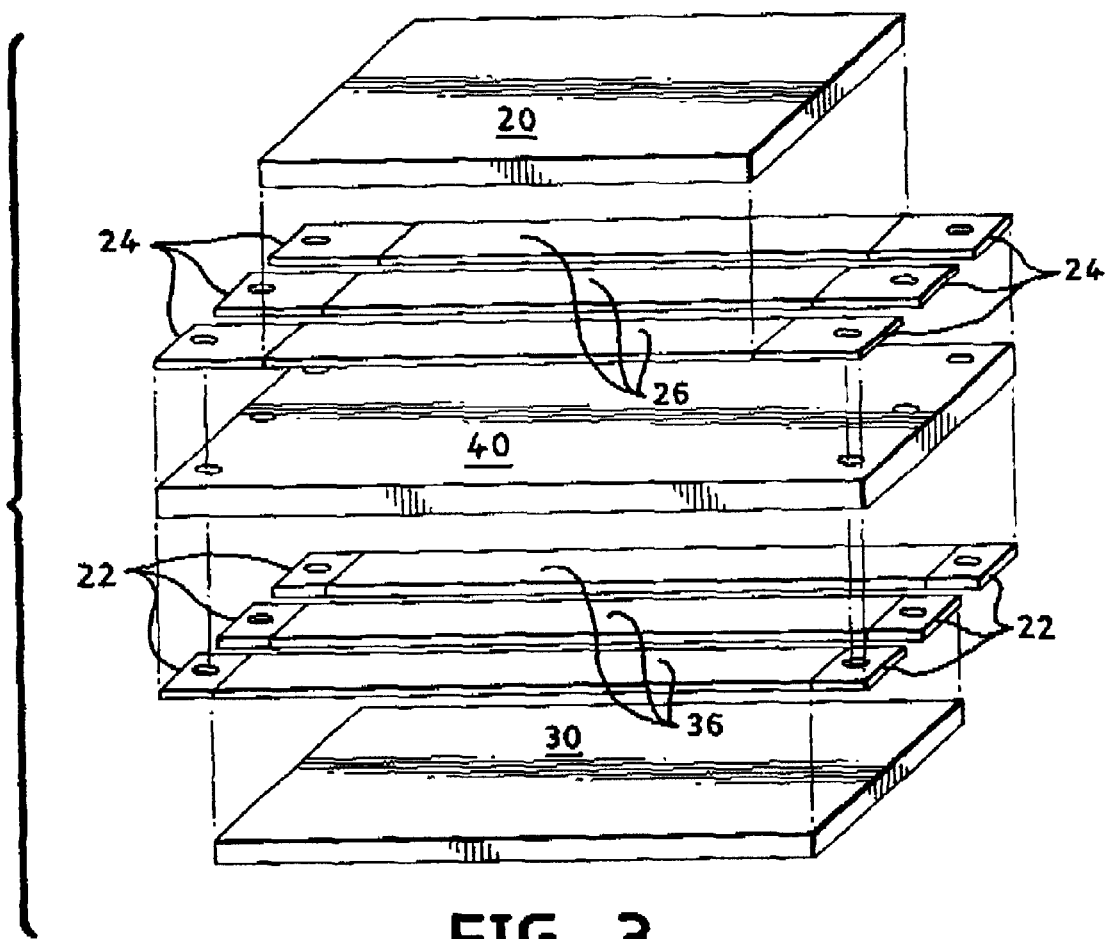
FIG. 3 depicts an exploded perspective view of the first preferred embodiment.

The jumper is shown in exploded view in FIG. 3. The jumper is made up of two sets of printed wires, which, in the preferred embodiments, are fabricated using well-known printed wire fabrication techniques, with the resulting wires being formed of copper foil. As used throughout the following description, the term "wire" will be used to include a central portion, called the "finger", and two portions called "pads", one attached to each end of each finger. Three layers of insulation are used. A preferred insulation material for this application is KAPTON®.

The jumper is seen to include a central insulation sheet 40, with an upper set of fingers 26 bonded to the upper side of the central insulation, and a lower set of fingers 36 bonded to the lower side of the central insulation sheet. The upper set of fingers in FIG. 3 have longer major pads 24 on both sides of each finger, and the shorter minor pads 22 on the both sides of the lower fingers. The upper and lower set of wires are the same in overall length, however, so that holes in the pads of the upper wires align with holes in the pads of the lower wires.

The jumper is seen to include a central insulation sheet 40, with an upper set of fingers 26 bonded to the upper side of the central insulation, and a lower set of fingers 36 bonded to the lower side of the central insulation sheet. The upper set of fingers in FIG. 3 have longer major pads 24 on both sides of each finger, and the shorter minor pads 22 on the both sides of the lower fingers. The upper and lower set of fingers is the same in overall length, however, so that holes in the pads of the upper fingers align with holes in the pads of the lower fingers.

An upper external insulation sheet 20 is then bonded onto the upper side of the upper set of fingers, and a lower insulation sheet 30 is bonded to the lower side of the lower set of fingers.

Figure 5A:
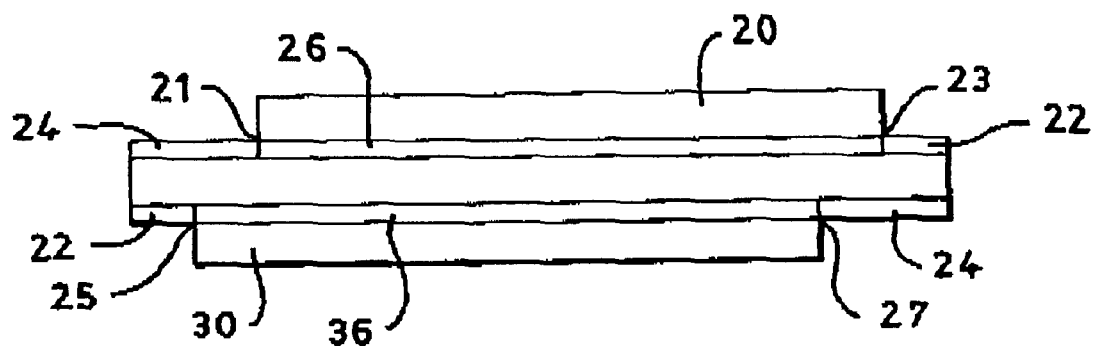
FIG. 5a depicts a cross-sectional view of the second preferred embodiment of the current invention.
Figure 5B:
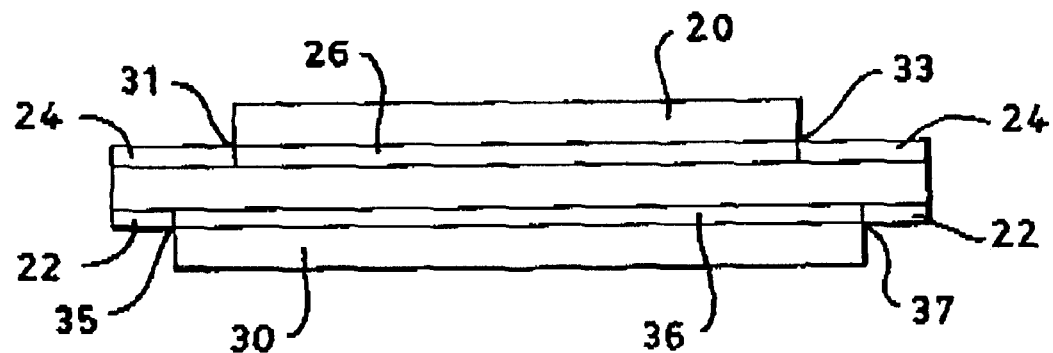
FIG. 5b depicts a cross sectional view of the first preferred embodiment of the current invention.

Referring now to FIG. 5b, a cross-sectional view of the jumper assembly of the first preferred embodiment shows that the upper fingers 26 and lower fingers 36, are bonded about the center insulator 40 so that the ends of the major pads 24 and minor pads 22 extend exactly to the ends of the center insulator and no farther. It is further seen that the junctions 31, 33, between the upper pads 24 and the corresponding fingers 26, do not align with the junctions 35, 37 between the lower pads 22 and the corresponding fingers 36.

It is noted that the upper insulation sheet 20 is disposed so as to leave the major and minor pads exposed so that they can be through plated, and then soldered to circuit boards to make interconnection between the boards. The through-plating is done through the holes in the pads shown in FIG. 3. The holes in the top pads are aligned with the holes in the bottom pads to facilitate this through-soldering. A preferred method of through soldering the plated-through holes is by means of the well-known method of reflow soldering.

Figure 4B:
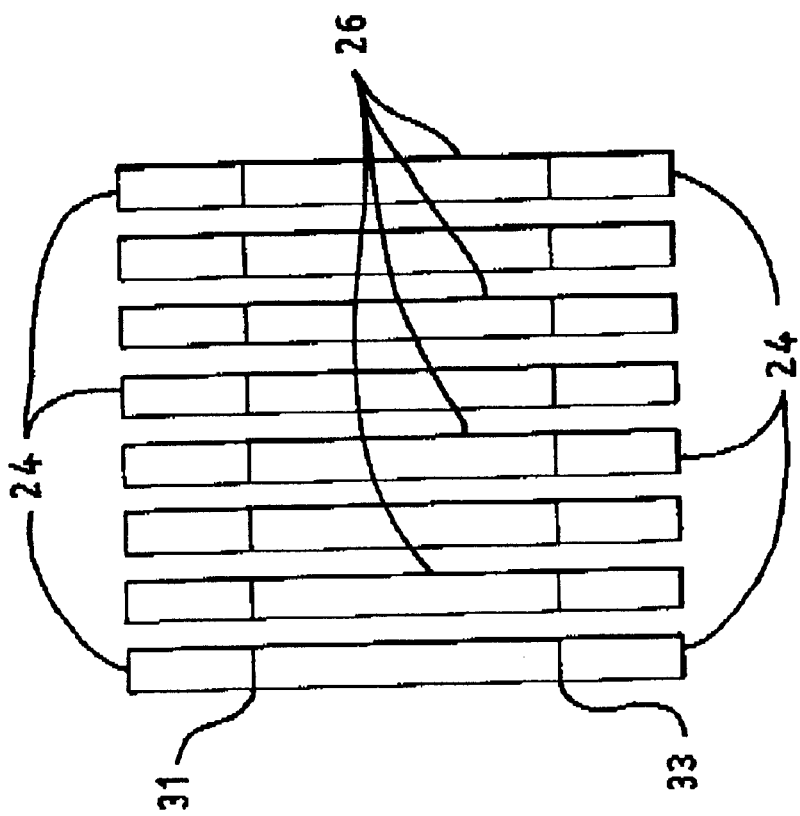
FIG. 4b depicts a bottom plan view of the first preferred embodiment of the current invention.
Figure 4A:
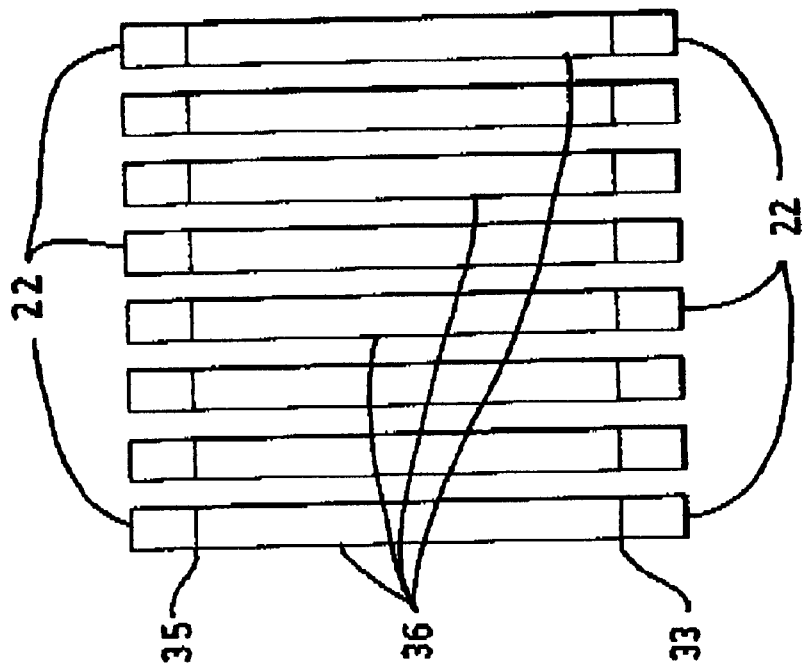
FIG. 4a depicts a top plan view of the first preferred embodiment of the current invention.

Referring now to FIGS. 4A and 4B, it is seen that a stress raiser is created at the junctions 31, 33 between the major pads and the upper fingers 26 when the assembly is bent. Similarly a stress raiser is created at the junctions 35, 37 between the minor pads and the lower fingers 36. However, the stress raisers 31 are not aligned with stress raisers 35, and the stress raisers 33 are not aligned with the stress raisers 37, thereby strengthening the assembly when it is bent.

It is seen that the asymmetry of the upper pads as related to the lower pads, displaces the upper and lower stress raisers, so that they do not occur along the same line on the center insulation sheet.

FIGS. 4A and 4B do not show the holes in the upper and lower pads, which have been omitted to simplify the drawing, although in practice, the pads contain plated-through holes.

The same effect of mis-aligning stress raisers can be obtained by having the upper fingers contain major pads on one end of each upper finger, and minor pads on the other ends, with each lower finger containing the same asymmetry of pad length.

FIG. 5a shows this second preferred embodiment. This embodiment differs from that of FIG. 5a only in that, in the first embodiment the upper stress raisers 31, 33 are both located between the two lower stress raisers 35, 37, while in the embodiment of FIG. 5a the upper stress raisers 21, 23 are both to the right of the lower stress raisers 25, 27.

Figure 2A:
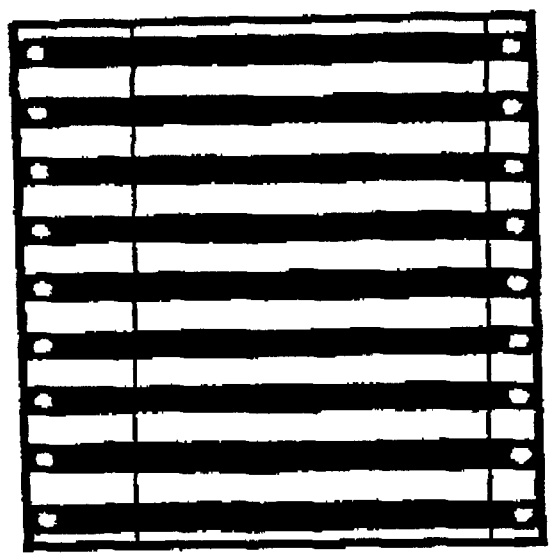
FIG. 2a depicts a top plan view of the second preferred embodiment of the current invention.
Figure 2B:
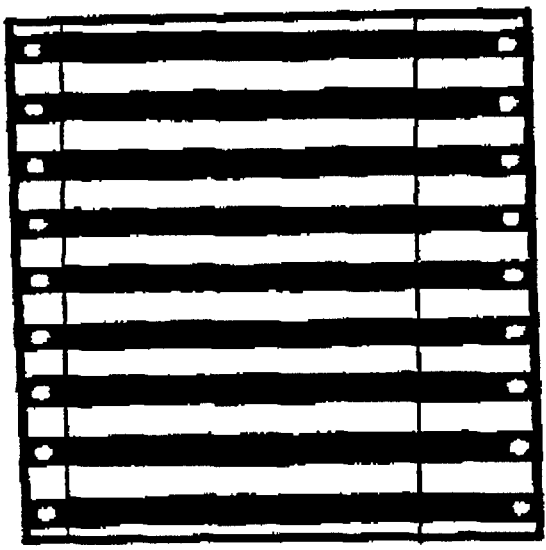
FIG. 2b depicts a bottom plan view of the second preferred embodiment of the current invention.

Referring now to FIGS. 2a and 2b, upper and lower plan views of the actual jumper are shown. The pads are shown with the plated-through holes formed through the entire assembly- that is, for each wire, through the upper pad, the central insulation sheet, and the lower pad. In the upper plan view the upper insulator extends between junctions 16, 18, creating stress raisers at these junctions. Similarly, the lower plan view of FIG. 2b shows stress raisers at the junctions 20, 22 between which the lines the lower insulator is bonded. In these figures, the pads have the same width as the fingers themselves, and are located between the junctions 16, 18, 20, 22 and the outsides of the assemblies.

Whichever embodiment is used, the basic principle of on which this invention is based contains the following elements: first, that two sets of fingers, or wires, are used to enhance both physical strength, and electrical conductivity; second, that a central layer of insulation separates the first and second set of fingers, which are arranged adjacent to each other across the central layer; thirdly, that plated-through holes are contained in each pad which terminates each wire or finger, and that the plated-though holes are used to attach adjacent pairs of wires by soldering; and finally, that the junctions between the pads and the body of the wires are offset between each adjacent pair.

While the invention has been described with reference to specific embodiments, it will be apparent that improvements and modifications may be made within the purview of the invention without departing from the scope of the invention defined in the appended claims.

I claim:

1. A jumper assembly for use in interconnecting electronic components, comprising:
   a central insulation sheet having an upper side and a lower side;
   a first and second set of wires spaced from each other, each wire having a top side, a bottom side, and two ends, and each wire further comprising:
   a finger having two ends;
   a major pad, having a length, integrally affixed to one end of the finger; and
   a minor pad, having a length different than that of the major pad, integrally affixed to the other end of the finger;
   the first set of wires bonded at the bottom side to the upper side of the central insulation sheet, and the second set of wires bonded at the top side to the lower side of the central insulation sheet, so that the major pads of one set of wires are adjacent to the minor pads of the other set of wires; and
   a first external insulation sheet bonded to the top side of the first set of wires, and
   a second external insulation sheet bonded to the bottom side of the second set of wires.

2. The jumper of claim 1, wherein a plated-through hole is formed in each pad.

3. The jumper of claim 2, wherein each pad has a facing pad disposed on the opposite side of the central insulation sheet, and further comprising a solder connection connecting the plated-through holes between each pad and the facing pad.

4. The jumper of claim 3, wherein the wires further comprise copper foil.

5. The jumper of claim 4, wherein the central insulation sheet, and the first and second external insulation sheets are flexible insulators.

6. The jumper of claim 5, wherein the insulation sheets comprise KAPTON.

7. The jumper of claim 6, wherein the solder connections between each pad and the facing pad are reflow-soldered connections.

8. A jumper assembly for use in interconnecting electronic components, comprising:
   a central insulation sheet having an upper side and a lower side;
   a first set of wires, spaced from each other, each wire having a top side, a bottom side, and two ends, and each wire further comprising:
   a finger having two ends; and
   two major pads, each having a length, integrally affixed to each end of the finger; and
   a second a first set of wires, spaced from each other, each wire having a top side, a bottom side, and two ends, and each wire further comprising:
   a finger having two ends; and
   two minor pads, each having a length different than that of the major pad, integrally affixed to each end of the finger;
   the first set of wires bonded at the bottom side to the upper side of the central insulation sheet, and the second set of wires bonded at the top side to the lower side of the central insulation sheet, so that the major pads of one set of wires are adjacent to the minor pads of the other set of wires; and
   a first external insulation sheet bonded to the top side of the first set of wires, and
   a second external insulation sheet bonded to the bottom side of the second set of wires.

9. The jumper of claim 8, wherein a plated-through hole is formed in each pad.

10. The jumper of claim 9, wherein each pad has a facing pad disposed on the opposite side of the central insulation sheet, and further comprising a solder connection connecting the plated-through holes between each pad and the facing pad.

11. The jumper of claim 10, wherein the wires further comprise copper foil.

12. The jumper of claim 11, wherein the central insulation sheet, and the first and second external insulation sheets are flexible insulators.

13. The jumper of claim 12, wherein the insulation sheets comprise KAPTON.

14. The jumper of claim 13, wherein the solder connections between each pad and the facing pad are reflow-soldered connections.

15. A method for manufacturing an asymmetric flexible jumper assembly comprising the following steps:
   Fabricating a central insulation sheet having an upper side and a lower side;
   Fabricating a first and second set of wires, spaced from each other, each wire having a top side, a bottom side, and two ends, and each wire further comprising:
   a finger having two ends;
   a major pad, having a length, integrally affixed to one end of the finger; and
   a minor pad, having a length different than that of the major pad, integrally affixed to the other end of the finger,
   bonding the first set of wires at the bottom side to the upper side of the insulation sheet, and the bonding second set of wires bonded at the top side to the lower side of the insulation sheet, so that the major pads of one set of wires are adjacent to the minor pads of the other set of wires;
   bonding a first external insulation sheet to the top side of the first set of wires,
   bonding a second external insulation sheet bonded to the bottom side of the second set of wires;
   drilling a hole through each upper pad, through the center insulating sheet, and through the adjacent lower pad; and
   through-plating each such hole.

* * * * *